(12) United States Patent
deBlanc et al.

(10) Patent No.: US 6,795,885 B1
(45) Date of Patent: Sep. 21, 2004

(54) ELECTRONIC DEVICE BACKPLANE INTERCONNECT METHOD AND APPARATUS

(75) Inventors: James J. deBlanc, Roseville, CA (US); David M. Dickey, Roseville, CA (US); James L. White, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 438 days.

(21) Appl. No.: 09/887,798

(22) Filed: Jun. 21, 2001

(51) Int. Cl.$^7$ .............................................. G06F 13/14
(52) U.S. Cl. ...................... 710/305; 361/788; 361/729; 361/733; 714/14
(58) Field of Search .............................. 710/301, 300, 710/100, 305, 306, 316; 370/225, 228; 714/4, 14

(56) References Cited

U.S. PATENT DOCUMENTS

| | | |
|---|---|---|
| 5,296,748 A | 3/1994 | Wicklund et al. |
| 5,386,535 A | 1/1995 | Carteau |
| 5,547,386 A | 8/1996 | Fredberg |
| 5,999,527 A | 12/1999 | Petersen |
| 6,006,341 A | 12/1999 | Kaminski |

FOREIGN PATENT DOCUMENTS

| | | |
|---|---|---|
| EP | 0726528 B1 | 8/1996 |
| EP | 1001345 A2 | 5/2000 |
| WO | WO0022711 A1 | 4/2000 |

OTHER PUBLICATIONS

European Search Report dated Dec. 20, 2002 for application EP 02254239.

*Primary Examiner*—Mark H. Rinehart
*Assistant Examiner*—Clifford Knoll

(57) ABSTRACT

Apparatus for connecting a plurality of electronic devices with corresponding backplanes to improve reliability of accessing the devices are described. In one embodiment, the apparatus includes first and second backplanes having connectors for at least one device. A device having a plurality of data paths has a first data path coupled to a data path connector of the first backplane. A second data path of the device is coupled to a data path connector of the second backplane. Alternatively, a Y-adapter is used to connect a single data path device to data path connectors of distinct backplanes. In various embodiments, the backplanes lie in a common plane. Alternatively, the backplanes lie in distinct parallel planes.

20 Claims, 3 Drawing Sheets

ELECTRONIC DEVICE BACKPLANE INTERCONNECT METHOD AND APPARATUS

FIELD OF THE INVENTION

This invention relates to methods and apparatus for enhancing the reliability of computer equipment. In particular, this invention is drawn to increasing interconnections between multiple controllers and multiple electronic devices to enhance reliability.

BACKGROUND OF THE INVENTION

Large capacity mass storage subsystems are typically shared with a number of computers. Such storage subsystems can be centrally located in secure facilities that offer backup power supplies, isolation from hazards, and other features to ensure reliable access to the stored data.

The storage subsystem is made up of a plurality of storage devices such as disk drives to minimize the extent of data loss in the event of failure of a single device. Such an organization also aids throughput by distributing the location of the data across multiple storage devices. Some systems deliberately distribute the data and error correction codes across multiple storage devices in ways that permit full recovery of the data even if one or more of the devices fails.

These approaches tend to assume complete device failure. Although the risk of catastrophic failure for the system as a whole is reduced through device redundancy, the risk of failure to individual devices is not addressed. Although reliability of the system is preserved, the system efficiency tends to decrease due to the additional overhead required to recover the lost data from the error correction codes and the remaining data.

Each storage device is interconnected with a backplane in a manner that presents numerous single failure points, for example, in the power, address, data, or control paths between the backplane and the storage device. Reduction of the number of these single points of failure is desirable for the purpose of increasing the reliability of individual storage devices and therefore the efficiency of the system as a whole.

SUMMARY OF THE INVENTION

Methods and apparatus for connecting a plurality of electronic devices with corresponding backplanes to improve reliability of accessing the devices are described. In one embodiment, the apparatus includes first and second backplanes having connectors for at least one device. A device having a plurality of data paths has a first data path coupled to a data path connector of the first backplane. A second data path of the device is coupled to a data path connector of the second backplane.

One apparatus includes a plurality of electronic devices and a plurality of backplanes. Each device has a plurality of data paths. Each backplane provides connectors for the same plurality of devices. The individual data paths for each device are connected to distinct backplanes.

Another embodiment includes first and second backplanes with connectors for at least one electronic device. A Y-coupler has first and second Y-connectors coupled to a common Y-connector. The first Y-connector is connected to a data path connector of the first backplane. The second Y-connector is connected to a data path connector of the second backplane. A device data path is connected to the common device connector.

In various embodiments, the backplanes are arranged to lie in a common plane. Alternatively, the backplanes are arranged to lie in distinct parallel planes. The devices may include nonvolatile memory devices such as disk drives.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
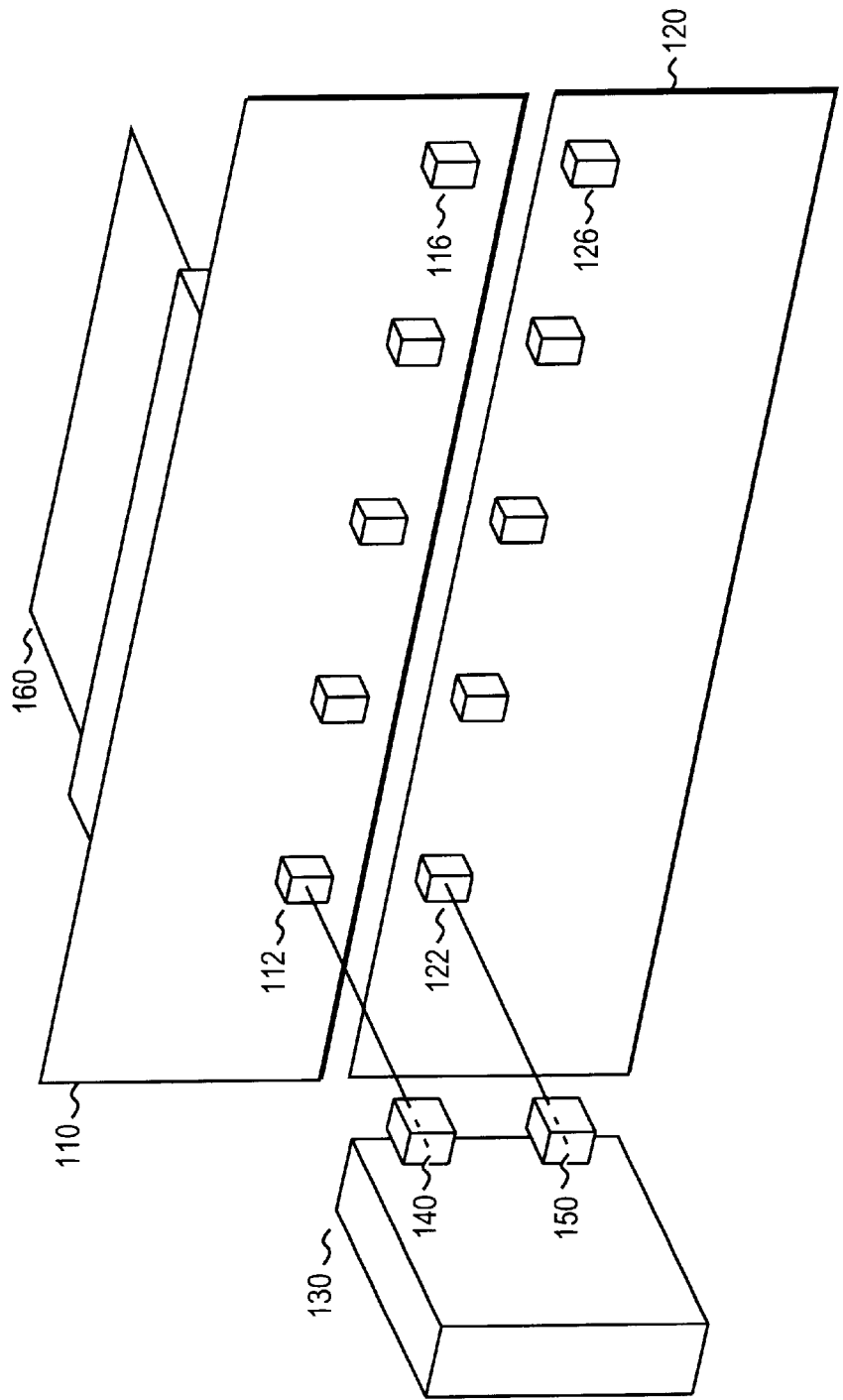
FIG. 1 illustrates another embodiment of an apparatus for interconnecting electronic devices and backplanes.

FIG. 1 illustrates backplanes 110, 120 for connecting an electronic device 130 to service paths for power, address, control, or data. Backplane 110, for example, includes connectors 112–116. Backplane 120 includes connectors 122–126. The service paths for each device are distributed across multiple backplanes to ensure that the backplane is not a single point of failure for service paths to the device. Typically, the backplanes and device(s) are protected by an enclosure. The enclosure and mechanical supports for the backplanes, however, are not illustrated for clarity.

In one embodiment, device 130 is a dual data path device with first 140 and second 150 connectors through which data may be communicated. The device can communicate independently through either data path. In one embodiment, device 130 is nonvolatile memory such as a disk drive. Each backplane may also be connected to a corresponding controller card 160. Generally for multiple devices each having multiple data paths, the individual data paths for each device are connected to data path connectors of distinct backplanes.

In one embodiment, device 130 is a storage device such as a magnetic or optical disk drive or other form of nonvolatile or even volatile memory. In the event one backplane or controller card fails, the storage device can be accessed through the other backplane or using the redundant controller card.

Alternatively, device 130 may be some other peripheral or input/output device connected to a card other than a controller card 160. For example, a multiplexor that connects a number of high bandwidth communications media may be connected to the backplanes as illustrated in any of FIGS. 1–3 with networking cards taking the place of controller cards.

Figure 2:
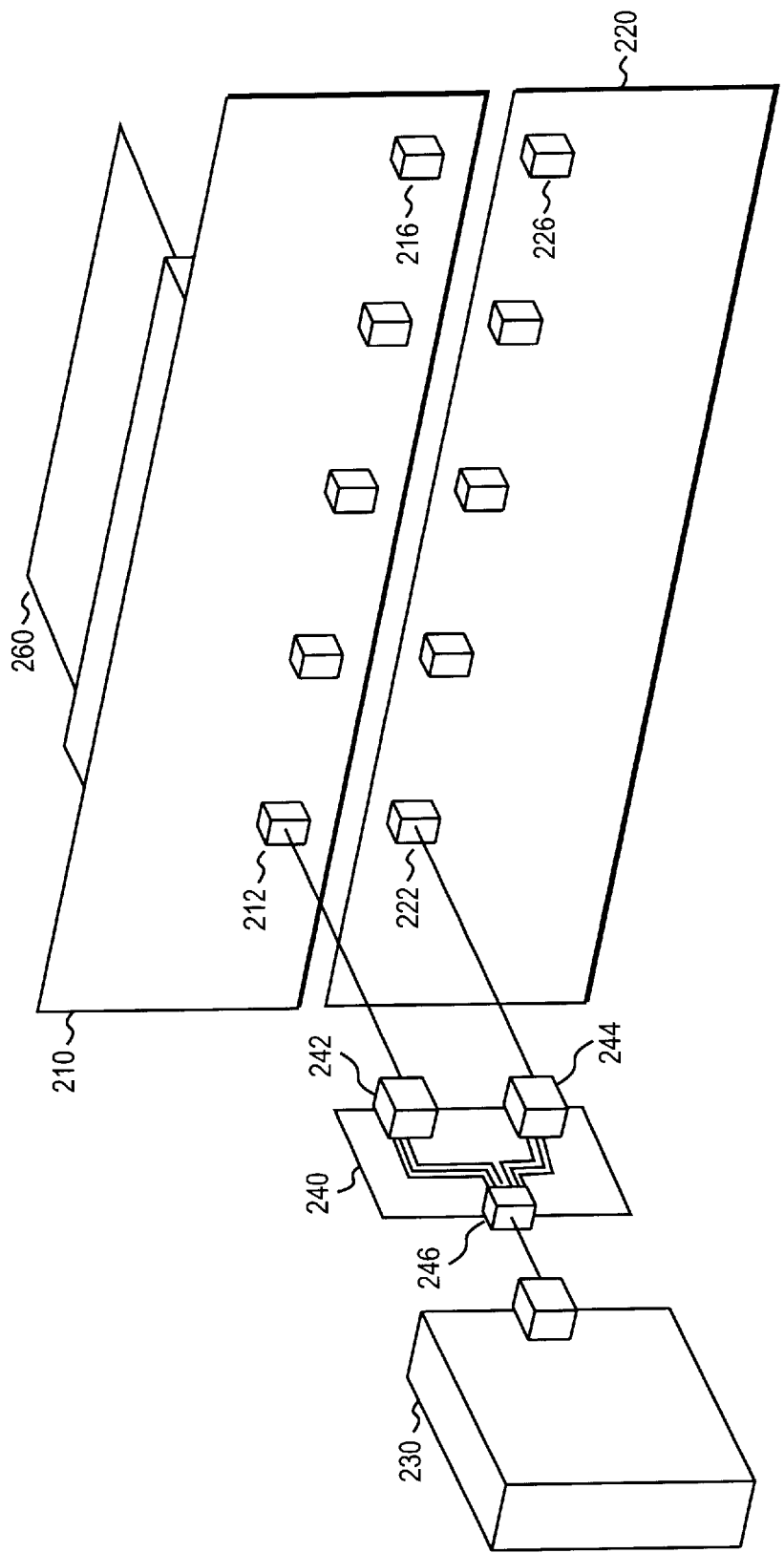
FIG. 2 illustrates another embodiment of an apparatus for interconnecting devices and backplanes.

FIG. 2 illustrates an alternative interconnection arrangement for use with single data path devices such as device 230. A Y-adapter 240 has Y-connectors 242, 244 which are coupled to a shared or common device connector 246. The device is connected to the common device connector 246 of the Y-adapter 240. Each connector of the Y-adapter is connected to a connector (212, 222) of distinct backplanes (210, 220). Each connector (212–216) of a given backplane 210 has a counterpart connector (222–226) on another backplane 220. The Y-adapter for a given device 230 is connected to a selected connector of a first backplane and the corresponding counterpart connector of a distinct second backplane.

Depending upon the requirements of the device and the configuration of the device data path connector, the same connector may be used to carry address signals, control signals, power, or some combination of these services in addition to data. Alternatively, the additional services may be dedicated to different connectors (i.e., 212–216).

Figure 3:
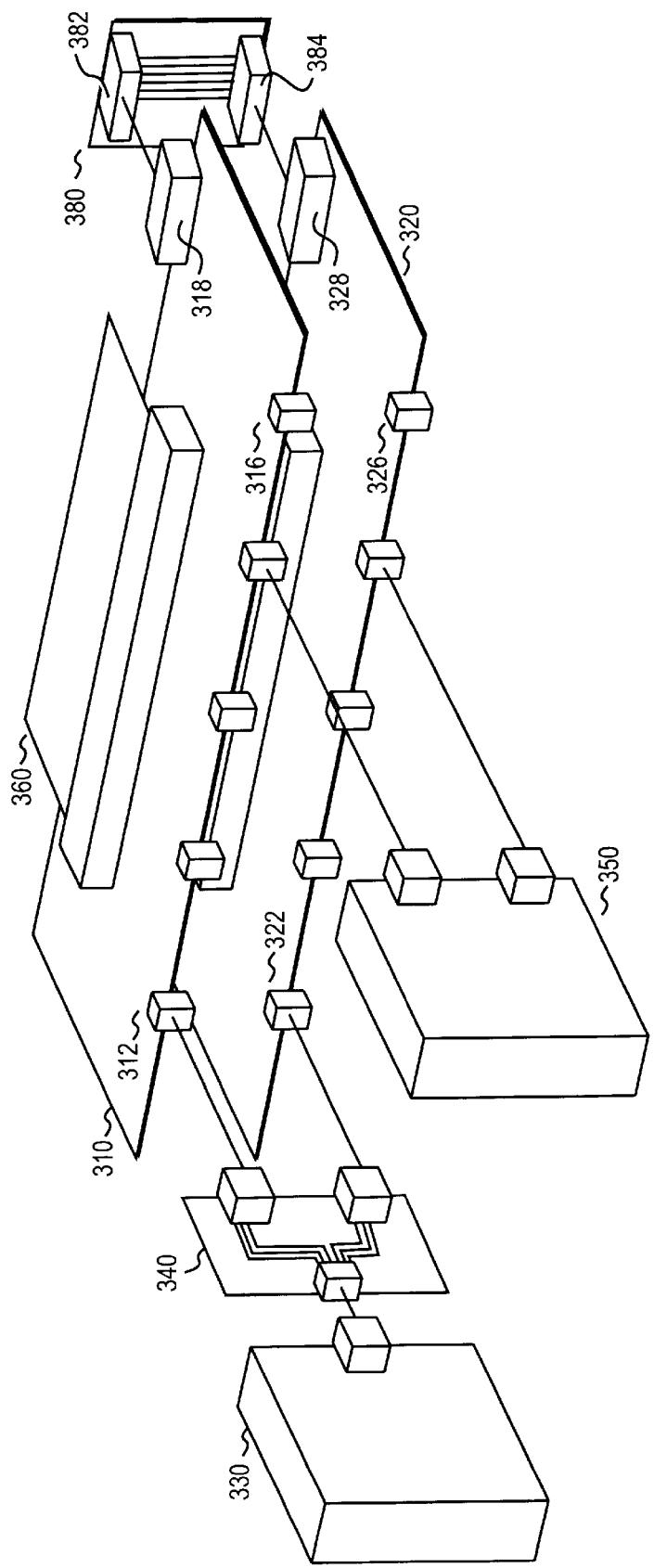
FIG. 3 illustrates another embodiment of an apparatus for interconnecting devices and backplanes.

FIG. 3 illustrates an alternative backplane configuration. The backplanes of FIGS. 1–2 generally lie in a common plane. Backplanes 310 and 320 of FIG. 3, however, are arranged to lie in parallel planes. The configuration of FIG. 3 may be better suited to accommodate air flow through any enclosure that the backplanes are disposed within. In one embodiment, the backplanes are also substantially parallel to the controller cards 360. As with FIGS. 1 and 2, the data paths of each device are distributed across multiple backplanes 310 and 320. For devices with a plurality of data paths such as dual data path devices 350, each path is connected to a connector on backplanes 310 and 320 so that the individual data paths are connected to distinct backplanes.

The data path of a single data path device 330 is connected to data path connectors of multiple backplanes through the use of Y-adapter 340. Each device 330 is thus connected to one of the connectors of the first backplane 310 and a corresponding connector on a distinct second backplane. As with FIGS. 1–2, each backplane connector 312–316, 322–326 may be used as a service path for some combination of address signals, control signals, or power in addition to data. Alternatively, the various services may be handled by individual connectors.

In one embodiment, a backplane linkage board 380 connects multiple backplanes 310, 320. The backplane link board has a first connector 382 that is connected to a corresponding connector 318 on the first backplane 310. The backplane linkage board has a second connector 384 that is connected to a corresponding connector 328 on the second backplane 320. The backplane linkage board 380 permits the controller card 360 of one backplane 310 to utilize another backplane 320 in the event backplane 310 is defective and backplane 320 is otherwise available. The backplane linkage board 380 alternatively enables some services (e.g., power) to be provided at a common location and distributed to all the backplanes.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a first backplane;
   a second backplane, wherein each of the first and second backplanes comprises a planar board having a plurality of connectors, wherein at least one of the first and second backplanes is configured to receive a card to the exclusion of the other backplane; and
   an electronic device having a plurality of data paths, wherein a first data path of the device is connected to a data path connector of the first backplane, wherein an alternate second data path of the device is connected to a data path connector of the second backplane, wherein the first and second backplanes are coupled to permit communication between the card and the electronic device through either of the first and second backplanes.

2. The apparatus of claim 1 wherein the device has a control signal path coupled to control signal path connectors of both the first and second backplanes.

3. The apparatus of claim 1 wherein the device has an address signal path coupled to address signal path connectors of both the first and second backplanes.

4. The apparatus of claim 1 wherein the device has a power supply path coupled to power supply path connectors of both the first and second backplanes.

5. The apparatus of claim 1 wherein the device is a nonvolatile memory.

6. The apparatus of claim 1 wherein the device is a disk drive.

7. The apparatus of claim 1 wherein each backplane is configured to receive a corresponding input/output controller card.

8. The apparatus of claim 1 further comprising:
   a backplane linkage board connecting another data path connector from the first backplane with another data path connector from the second backplane, the backplane linkage board providing the coupling between the first and second backplanes to permit the communication between the card and the electronic device through either of the first and second backplanes.

9. The apparatus of claim 1 wherein the first and second backplanes lie in substantially parallel planes.

10. The apparatus of claim 1 wherein the first and second backplanes lie in a common plane.

11. An apparatus comprising:
    a plurality of electronic devices, each device having a plurality of data paths; and
    a plurality of backplanes, wherein at least one backplane is configured to receive a card to the exclusion of the other backplanes, wherein each backplane comprises a planar board providing connectors for the same plurality of devices, wherein the individual data paths for each device are connected to data path connectors of distinct backplanes, wherein the plurality of backplanes is coupled to permit communication between the card and the electronic device through any of the plurality of backplanes.

12. The apparatus of claim 11 wherein each device has a control signal path coupled to control signal path connectors of distinct backplanes.

13. The apparatus of claim 11 wherein each device has an address signal path coupled to address signal path connectors of distinct backplanes.

14. The apparatus of claim 11 wherein each device has a power supply path coupled to power supply path connectors of distinct backplanes.

15. The apparatus of claim 11 wherein the device is a nonvolatile memory.

16. The apparatus of claim 11 wherein the device is a disk drive.

17. The apparatus of claim 11 wherein the plurality of backplanes lie in substantially distinct parallel planes.

18. The apparatus of claim 11 wherein the plurality of backplanes lie in a common plane.

19. An apparatus comprising:
    a first backplane;
    a second backplane, wherein each of the first and second backplanes comprises a planar board having a plurality of connectors, wherein at least one of the first and second backplanes is configured to receive a card to the exclusion of the other backplane;
    a Y-adapter having first and second Y-connectors coupled to a common device connector, wherein the first Y-connector is connected to a data path connector of the first backplane, wherein the second Y-connector is connected to a data path connector of the second backplane; and an electronic device having a data path, wherein the device data path is connected to the common device connector, wherein the first and second backplanes are coupled to permit communication between the card and the electronic device using either of the first and second backplanes.

20. The apparatus of claim 19 wherein the first and second backplanes lie in substantially distinct parallel planes.

* * * * *